(12) United States Patent
Zhou et al.

(10) Patent No.: US 9,577,029 B2
(45) Date of Patent: Feb. 21, 2017

(54) METAL-INSULATOR-METAL CAPACITOR STRUCTURE AND METHOD FOR MANUFACTURING THE SAME

(71) Applicant: UNITED MICROELECTRONICS CORPORATION, Hsinchu (TW)

(72) Inventors: Zhi-Biao Zhou, Singapore (SG); Shao-Hui Wu, Singapore (SG); Chi-Fa Ku, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/549,549

(22) Filed: Nov. 21, 2014

(65) Prior Publication Data
US 2016/0133687 A1    May 12, 2016

(30) Foreign Application Priority Data
Nov. 6, 2014    (CN) .......................... 2014 1 0621397

(51) Int. Cl.
*H01L 49/02*    (2006.01)

(52) U.S. Cl.
CPC .................................... *H01L 28/91* (2013.01)

(58) Field of Classification Search
CPC ...................................................... H01L 28/91
See application file for complete search history.

(56) References Cited

U.S. PATENT DOCUMENTS

| | | | |
|---|---|---|---|
| 6,472,721 B2 | 10/2002 | Ma | |
| 2007/0152295 A1* | 7/2007 | Yeh | ..................... H01L 23/5223 257/516 |
| 2008/0157277 A1* | 7/2008 | Park | ....................... H01L 28/40 257/532 |
| 2010/0213572 A1 | 8/2010 | Ching | |
| 2012/0091559 A1 | 4/2012 | Tu | |
| 2014/0159199 A1* | 6/2014 | Lee | ................... H01L 29/66181 257/532 |
| 2014/0167265 A1* | 6/2014 | Kioussis | ............. H01L 21/4814 257/741 |

* cited by examiner

*Primary Examiner* — Long Pham
(74) *Attorney, Agent, or Firm* — Ding Yu Tan

(57) ABSTRACT

A metal-insulator-metal (MIM) capacitor structure and a method for manufacturing the same. The method includes a step hereinafter. A 5-layered dual-dielectric structure is provided on a substrate. The 5-layered dual-dielectric structure includes a bottom metal layer, a first dielectric layer, an intermediate metal layer, a second dielectric layer and a top metal layer in order. The first dielectric layer and the second dielectric layer have different thicknesses.

2 Claims, 19 Drawing Sheets

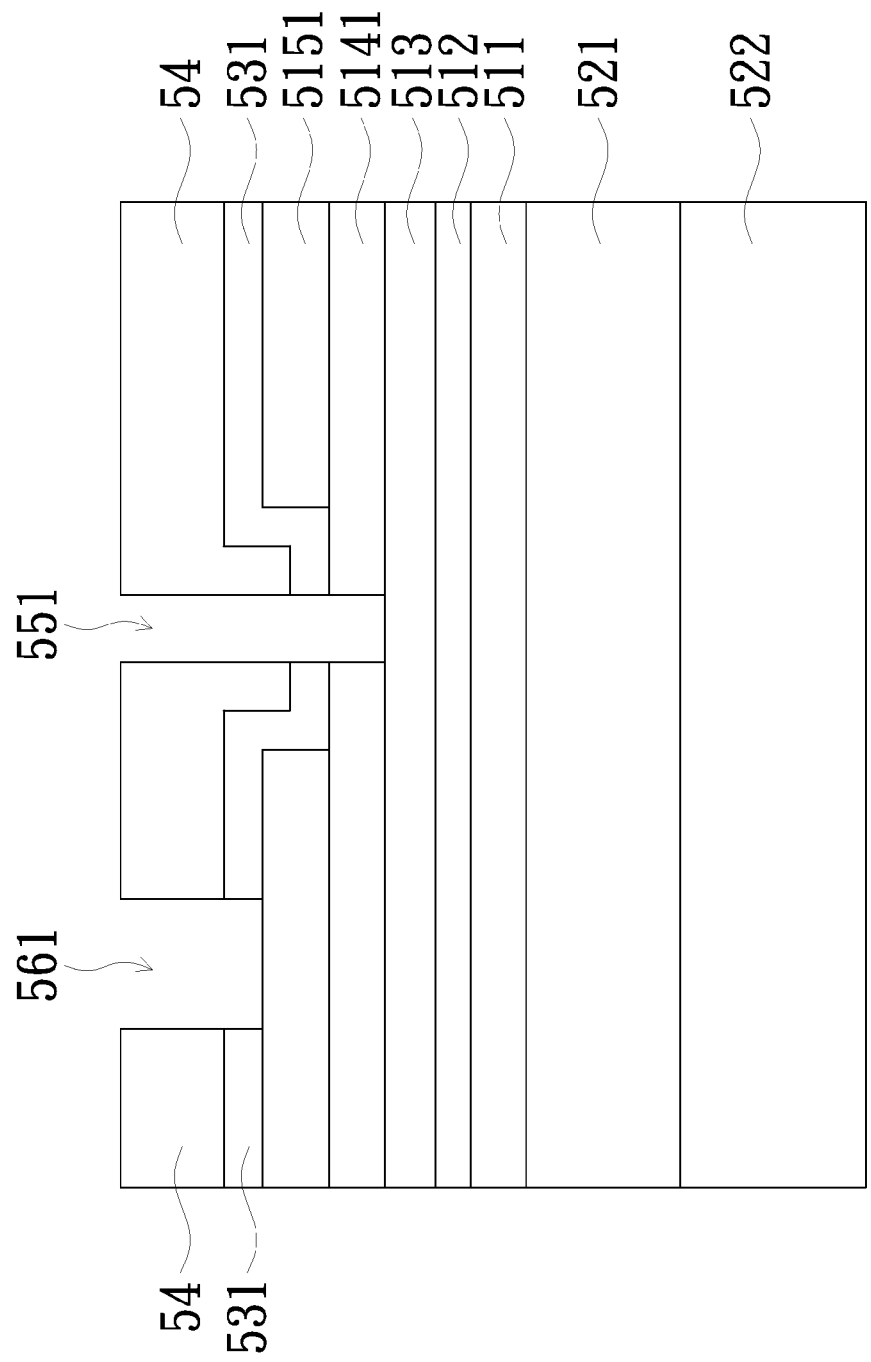

METAL-INSULATOR-METAL CAPACITOR STRUCTURE AND METHOD FOR MANUFACTURING THE SAME

FIELD OF THE INVENTION

The present invention generally relates to a semiconductor processing technology and, more particularly to, a metal-insulator-metal (MIM) capacitor structure and a method for manufacturing the same.

BACKGROUND OF THE INVENTION

In the field of integrated circuit (IC) technology, MIM capacitors have attracted attention because of their applications in functional circuits such as mixed signal circuits, analog circuits, radio frequency (RF) circuits, dynamic random access memory (DRAM), and logic operation circuits.

In U.S. Pat. No. 8,143,699, a dual-dielectric MIM capacitor is disclosed. FIG. 1 is a cross-sectional view of an MIM capacitor taught in U.S. Pat. No. 8,143,699. In FIG. 1, the MIM capacitor 10 includes a substrate 12 divided into a first region 100 and a second region 200, in each of which is provided with a capacitor 102 and 202, respectively. The capacitor 102 includes a top electrode 124, a bottom electrode 122 and a dielectric layer 130 sandwiched therebetween. In FIG. 1, the dielectric layer 130 further includes a first dielectric layer 1301 and a second dielectric layer 1302. The capacitor 102 is connected to a circuit 110 underneath by a plug 106. Similarly, the capacitor 202 includes a top electrode 224, a bottom electrode 222 and a dielectric layer 230 sandwiched therebetween, and is connected to a transistor 240 underneath by a plug 206.

Since the two capacitors 102 and 202 of the above MIM capacitor 10 are at the same level to occupy a larger chip area, which is unfavorable to high density IC applications, there is need in providing an MIM capacitor structure with a vertical capacitor structure and a manufacturing method thereof to minimize the chip area occupied by the MIM capacitor structure.

SUMMARY OF THE INVENTION

It is one object of the present invention to provide an MIM capacitor structure and a method for manufacturing the same, in which a vertical capacitor structure is used to minimize the chip area occupied by the MIM capacitor structure.

It is another object of the present invention to provide an MIM capacitor structure and a method for manufacturing the same, in which a 5-layered dual-dielectric structure is used to provide an MIM capacitor structure for high density and/or high voltage applications.

It is still another object of the present invention to provide an MIM capacitor structure and a method for manufacturing the same, in which a vertical capacitor structure is used to provide various capacitances with different connections by plugs.

In order to achieve the foregoing object, in one embodiment, the present invention provides a method for manufacturing an MIM capacitor structure. The method includes a step hereinafter. A 5-layered dual-dielectric structure is provided on a substrate. The 5-layered dual-dielectric structure includes a bottom metal layer, a first dielectric layer, an intermediate metal layer, a second dielectric layer and a top metal layer in order. The first dielectric layer and the second dielectric layer have different thicknesses.

In order to achieve the foregoing object, in one embodiment, the present invention further provides an MIM capacitor structure. The MIM capacitor structure includes a 5-layered dual-dielectric structure on a substrate. The 5-layered dual-dielectric structure includes a bottom metal layer, a first dielectric layer, an intermediate metal layer, a second dielectric layer and a top metal layer in order. The first dielectric layer and the second dielectric layer have different thicknesses.

BRIEF DESCRIPTION OF THE DRAWINGS

The present invention will become more readily apparent to those ordinarily skilled in the art after reviewing the following detailed description and accompanying drawings, in which:

FIG. 3A to FIG. 3F are cross-sectional views showing a method for manufacturing an MIM capacitor structure according to a second embodiment of the present invention.

DETAILED DESCRIPTION OF PREFERRED EMBODIMENTS

The present invention will now be described more specifically with reference to the following embodiment. It is to be noted that the following descriptions of the preferred embodiment of this invention are presented herein for purpose of illustration and description only. It is not intended to be exhaustive or to be limited to the precise form disclosed.

Please refer to FIG. 2A to FIG. 2F for cross-sectional views showing a method for manufacturing an MIM capacitor structure 30 according to a first embodiment of the present invention. The method of the first embodiment includes the steps described hereinafter.

Figure 1:
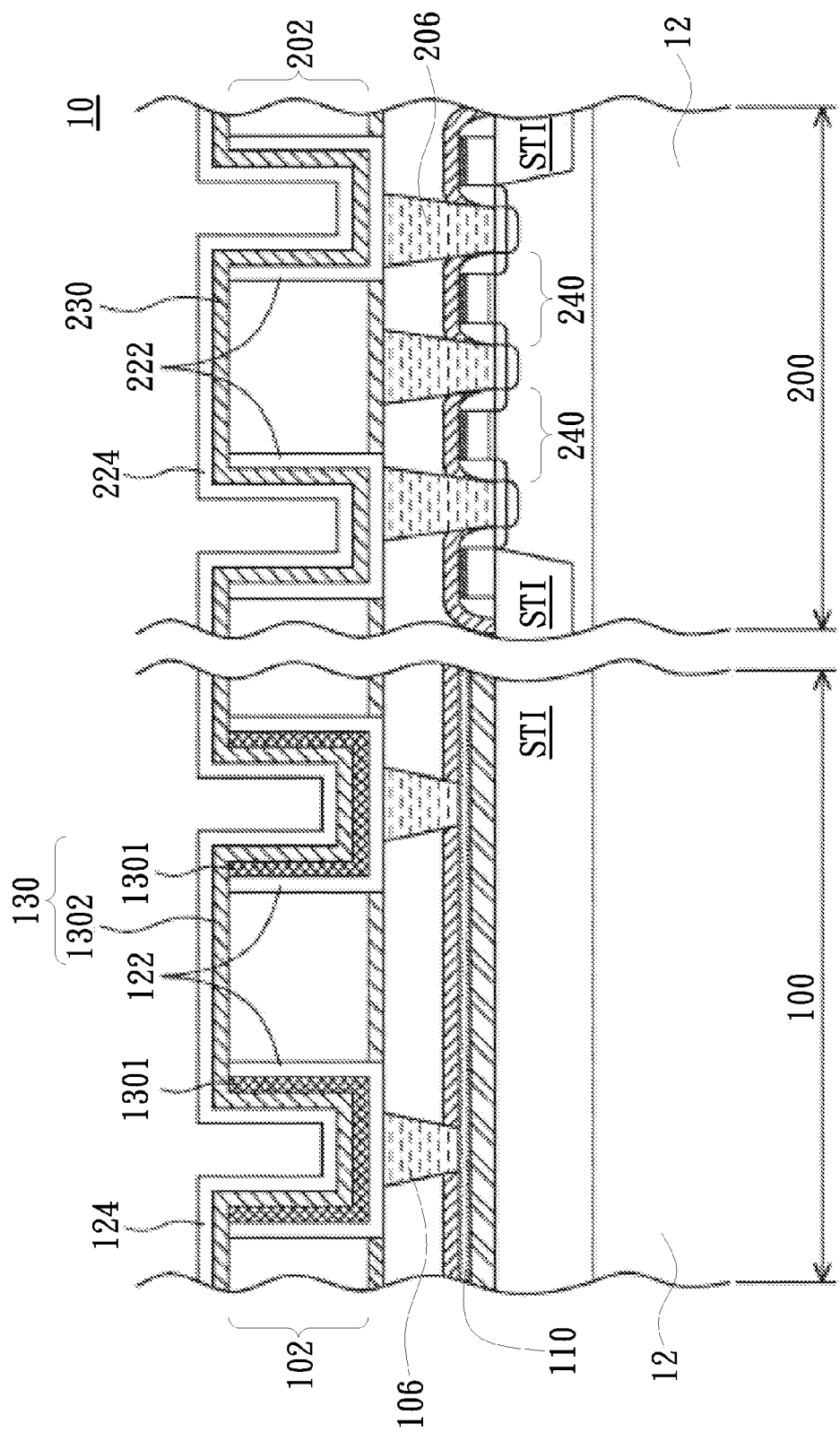
FIG. 1 is a cross-sectional view of an MIM capacitor described in U.S. Pat. No. 8,143,699.
Figure 2A:
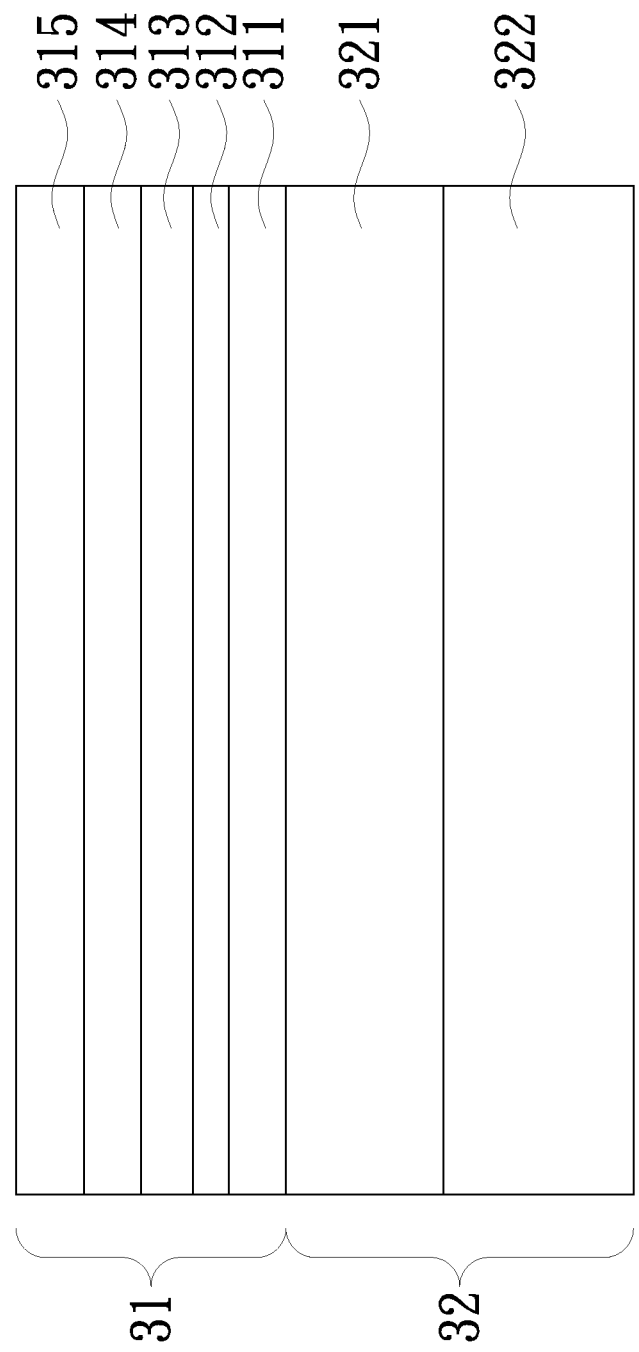
FIG. 2A to FIG. 2F are cross-sectional views showing a method for manufacturing an MIM capacitor structure according to a first embodiment of the present invention.

As shown in FIG. 2A, a 5-layered dual-dielectric structure 31 is provided on a substrate 32. The 5-layered dual-dielectric structure 31 includes a bottom metal layer 311, a first dielectric layer 312, an intermediate metal layer 313, a second dielectric layer 314 and a top metal layer 315 in order. The substrate 32 includes a low-k dielectric layer 321 on a metal layer 322. It should be noted that the first dielectric layer 312 and the second dielectric layer 314 have different thicknesses.

In some embodiments, the bottom metal layer 311, the intermediate metal layer 313 and the top metal layer 315 may include metal nitride, such as TiN, TaN, etc. However, the present invention is not limited to these materials for the respective metal layers.

In some embodiments, the first dielectric layer 312 and the second dielectric layer 314 may include different materials for different purposes according to practical demands. For example, the first dielectric layer 312 and the second dielectric layer 314 may include materials for high density or high voltage applications. In one embodiment, the first dielectric layer 312 may include a material for high density applications, while the second dielectric layer 314 may include a material for high voltage applications. The first dielectric layer 312 may be a nitride layer having a thickness of 20 nm to 40 nm, such as silicon nitride (SiN), while the second dielectric layer 314 may be a nitride layer such as SiN having a thickness of 70 nm to 150 nm, Preferably, the thickness of the first dielectric layer 312 is about 30 nm, while the thickness of the second dielectric layer 314 is about 100 nm.

Alternatively, in other embodiments, the first dielectric layer 312 may include a material for high density applications, while the second dielectric layer 314 may include a material for high voltage applications. The first dielectric layer 312 may be a high-k dielectric layer having a thickness of 3 nm to 10 nm, such as hafnium oxide (HfO), while the second dielectric layer 314 may be a nitride layer such as SiN having a thickness of 70 nm to 150 nm. Preferably, the thickness of the first dielectric layer 312 is about 5 nm, while the thickness of the second dielectric layer 314 is about 100 nm.

However, the present invention is not limited to the arrangement and the materials of the first dielectric layer 312 and the second dielectric layer 314 as being described above. For example, in some embodiments, the first dielectric layer 312 may include a material for high voltage applications, while the second dielectric layer 314 may include a material for high density applications. The first dielectric layer 312 may be a nitride layer such as silicon nitride (SiN) having a thickness of 70 nm to 150 nm, while the second dielectric layer 314 may be a nitride layer such as SiN having a thickness of 20 nm to 40 nm. Preferably, the thickness of the first dielectric layer 312 is about 100 nm, while the thickness of the second dielectric layer 314 is about 30 nm. Alternatively, the first dielectric layer 312 may be a nitride layer such as SiN having a thickness of 70 nm to 150 nm, while the second dielectric layer 314 may be a high-k dielectric layer such as HfO having a thickness of 3 nm to 10 nm. Preferably, the thickness of the first dielectric layer 312 is about 100 nm, while the thickness of the second dielectric layer 314 is about 5 nm.

Figure 2B:
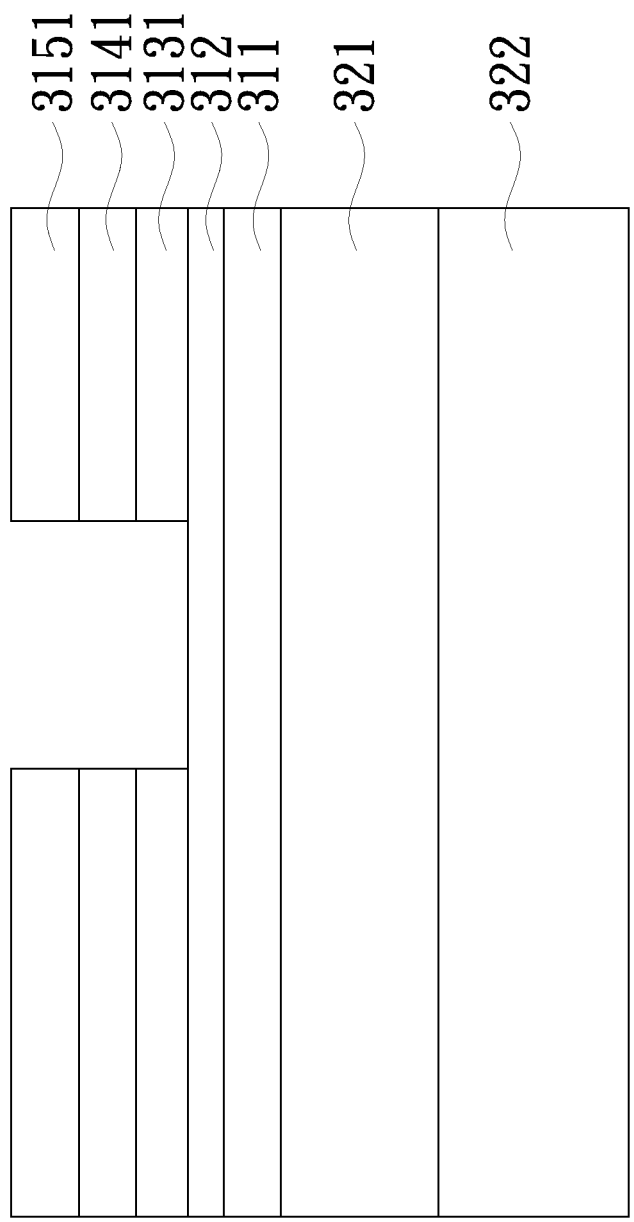

Then, as shown in FIG. 2B, the 5-layered dual-dielectric structure 31 is patterned to form a trench to expose the first dielectric layer 312. More particularly, the trench is defined by the intermediate metal layer 3131, the second dielectric layer 3141 and the top metal layer 3151 that have been patterned, respectively.

Figure 2C:
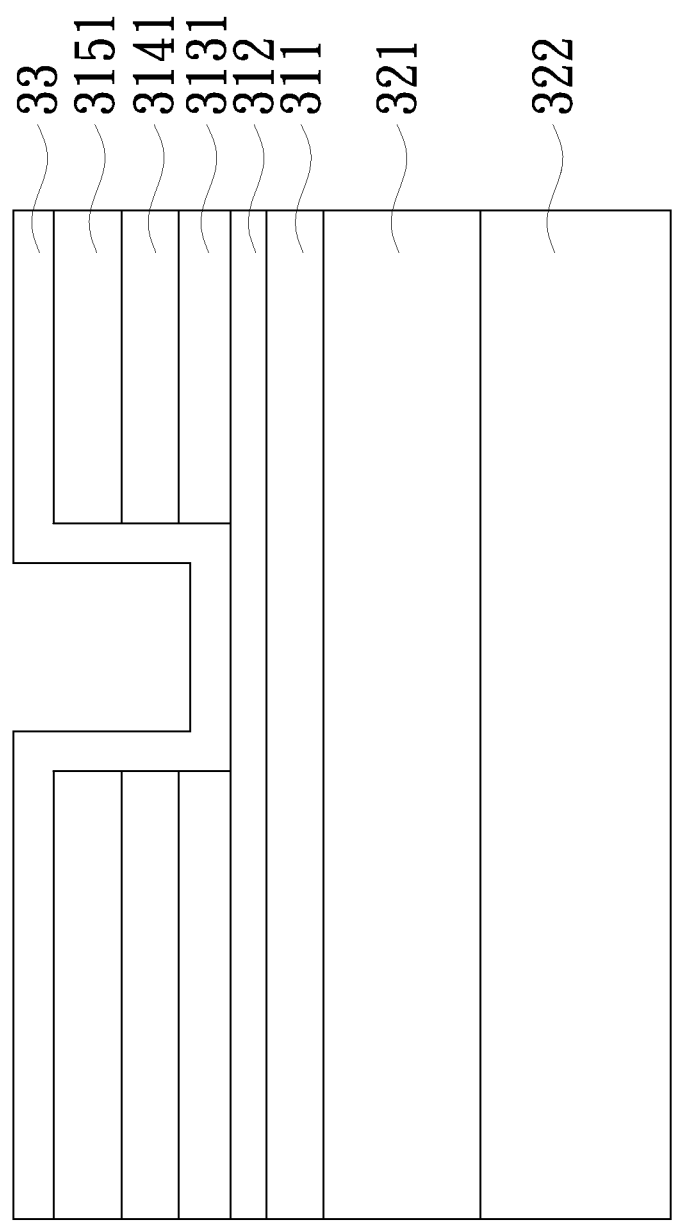

In FIG. 2C, a cap layer 33 is formed conformally on the 5-layered dual-dielectric structure 31. In the present embodiment, the cap layer 33 may include nitride. However, the present invention is not limited to nitride as being the material used in the cap layer 33.

Figure 2D:
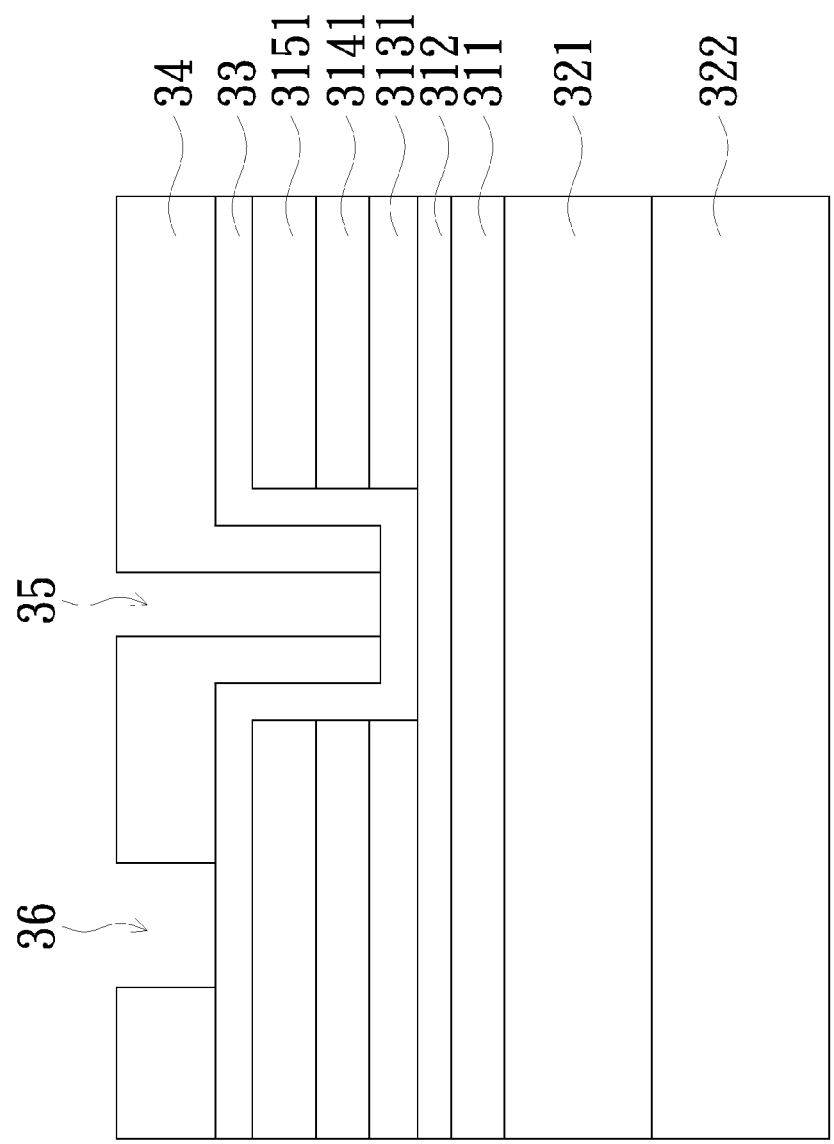

Then, as shown in FIG. 2D, a patterned photoresist layer 34 is provided to form a first trench 35 to expose a first portion of the cap layer 33 on the first dielectric layer 312 and to form a second trench 36 to expose a second portion of the cap layer 33 on the top metal layer 3151.

Figure 2E:
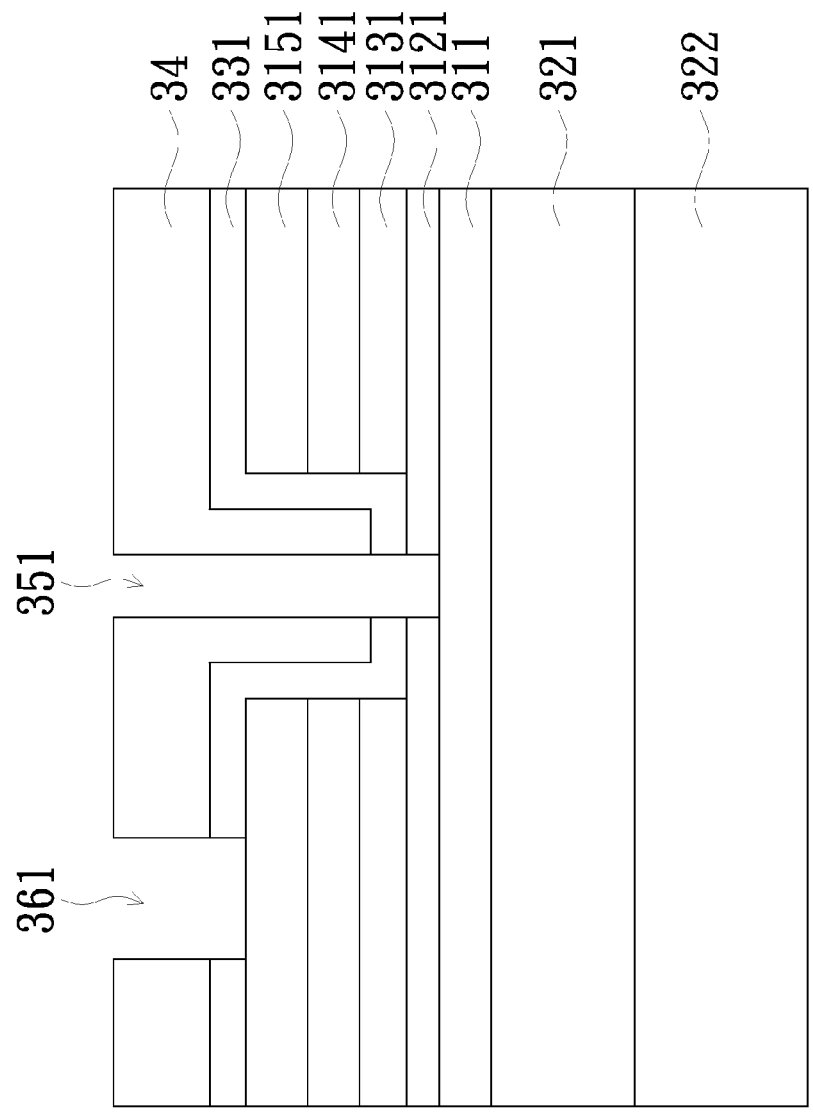

In FIG. 2E, the first portion of the cap layer 331 and a portion of the first dielectric layer 3121 underneath the first portion of the cap layer 331 are removed to expose the bottom metal layer 311, and the second portion of the cap layer 331 is removed to expose the top metal layer 3151.

Figure 2F:
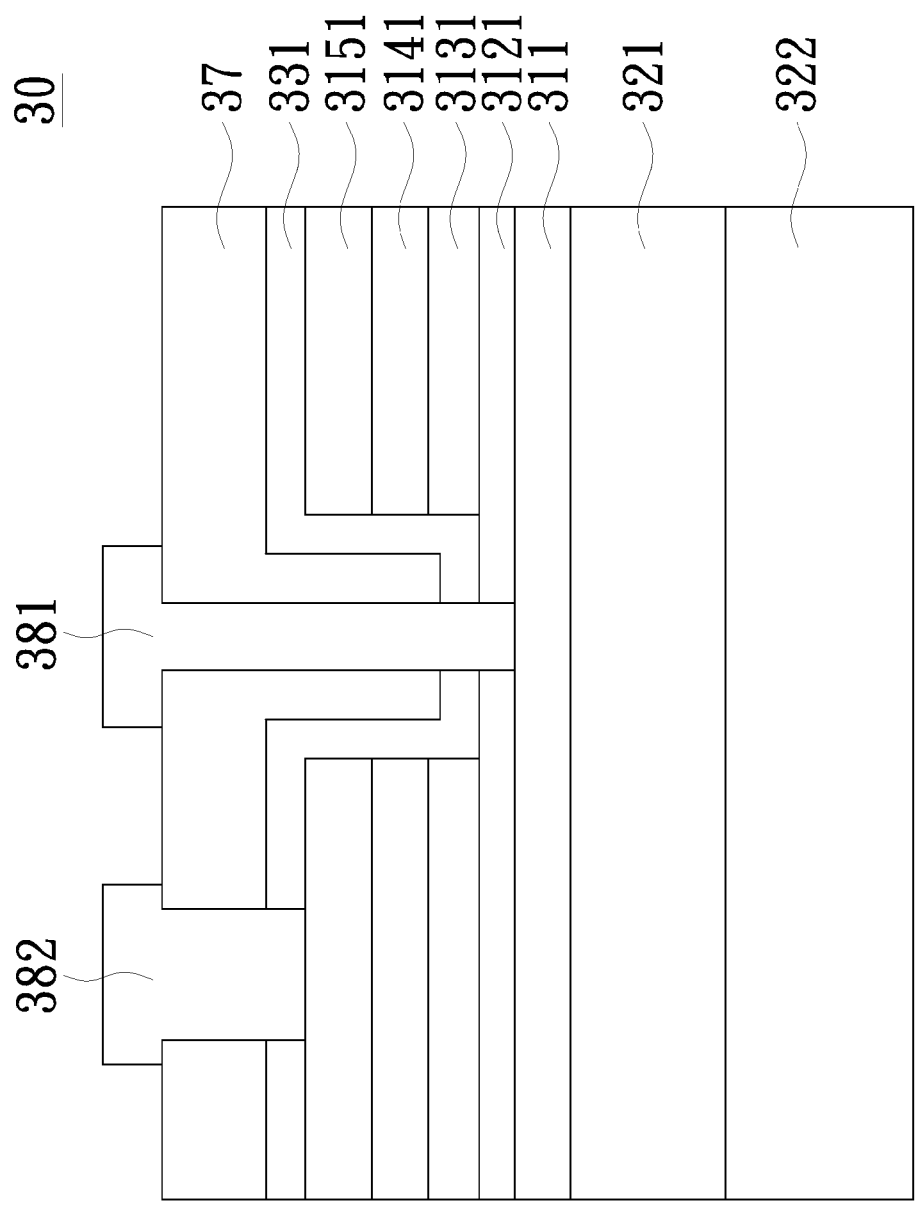

At last, in FIG. 2F, the patterned photoresist layer 34 (as shown in FIG. 2E) is removed to form a patterned dielectric layer 37. A first plug 381 is formed by filling a conductor in the first trench 351 (as shown in FIG. 2E) to connect the bottom metal layer 311, and a second plug 382 is formed by filling a conductor in the second trench 361 (as shown in FIG. 2E) to connect the top metal layer 3151. Accordingly, an MIM capacitor 30 including two serially connected capacitors is formed according to the first embodiment of the present invention.

Please refer to FIG. 3A to FIG. 3F for cross-sectional views showing a method for manufacturing an MIM capacitor structure 50 according to a second embodiment of the present invention. The method includes the steps described hereinafter.

Figure 3A:
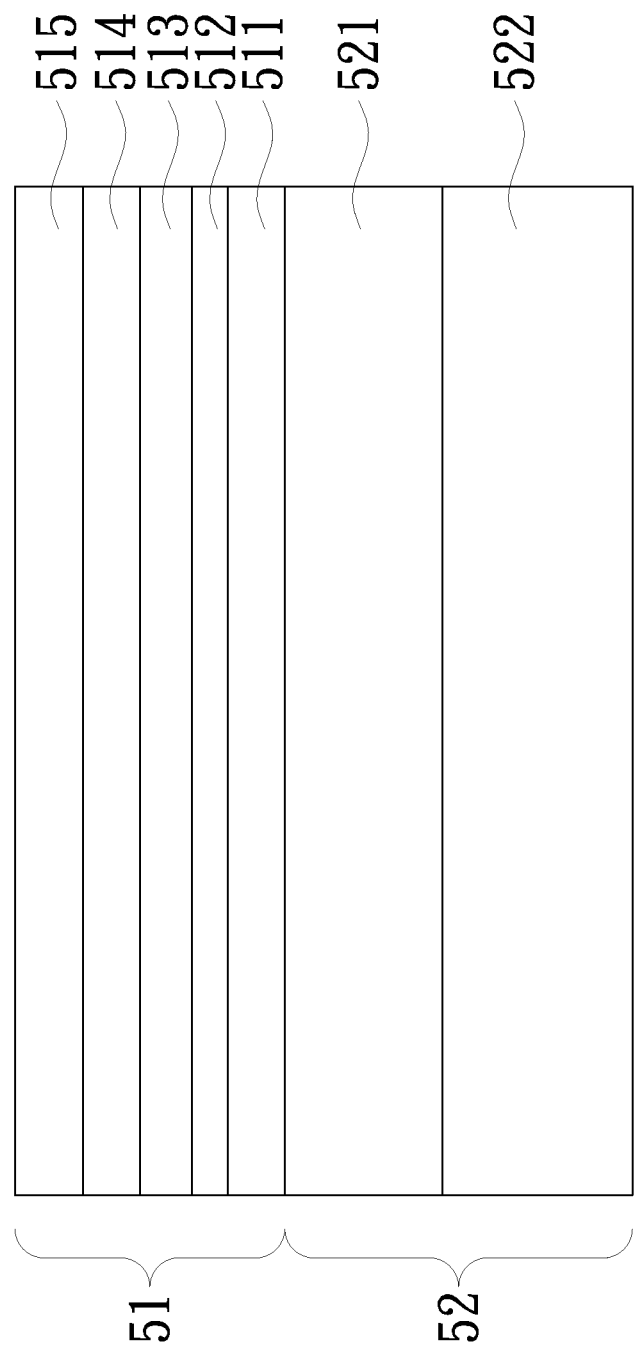

As shown in FIG. 3A, a 5-layered dual-dielectric structure 51 is provided on a substrate 52. The 5-layered dual-dielectric structure 51 includes a bottom metal layer 511, a first dielectric layer 512, an intermediate metal layer 513, a second dielectric layer 514 and a top metal layer 515 in order. The substrate 52 includes a low-k dielectric layer 521 on a metal layer 522. It should be noted that the first dielectric layer 512 and the second dielectric layer 514 have different thicknesses.

In the present embodiment, the elements in FIG. 3A use the same materials and thicknesses as the corresponding elements in FIG. 2A, and redundant descriptions thereof are not repeated herein.

Figure 3B:
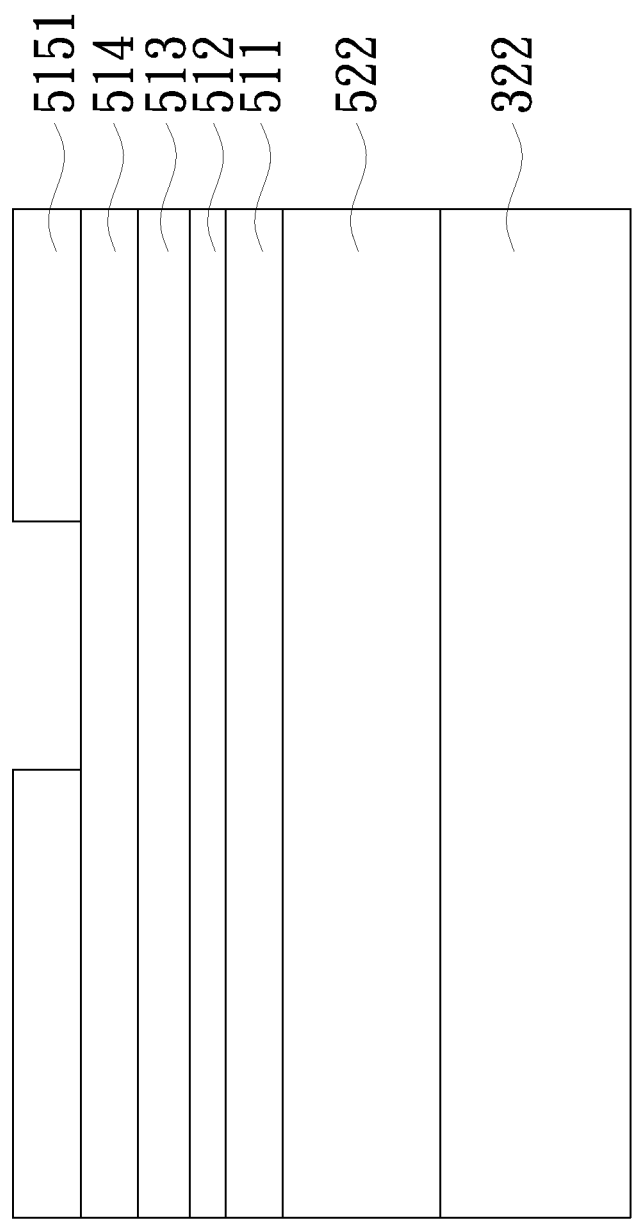

Then, as shown in FIG. 3B, the 5-layered dual-dielectric structure 51 is patterned to form a trench to expose the second dielectric layer 514. More particularly, the trench is defined by a top metal layer 5151 that have been patterned.

Figure 3C:
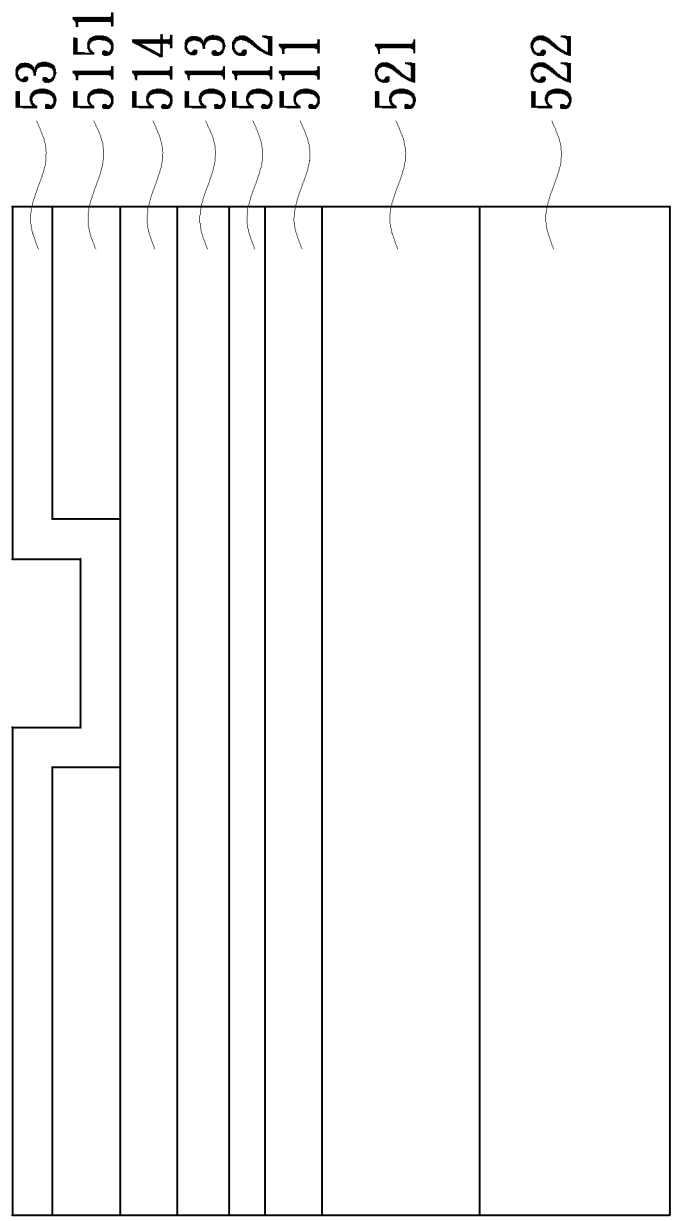

In FIG. 3C, a cap layer 53 is formed conformally on the 5-layered dual-dielectric structure 51. In the present embodiment, the cap layer 53 may include nitride. However, the present invention is not limited to nitride as being the material used in the cap layer 53.

Figure 3D:
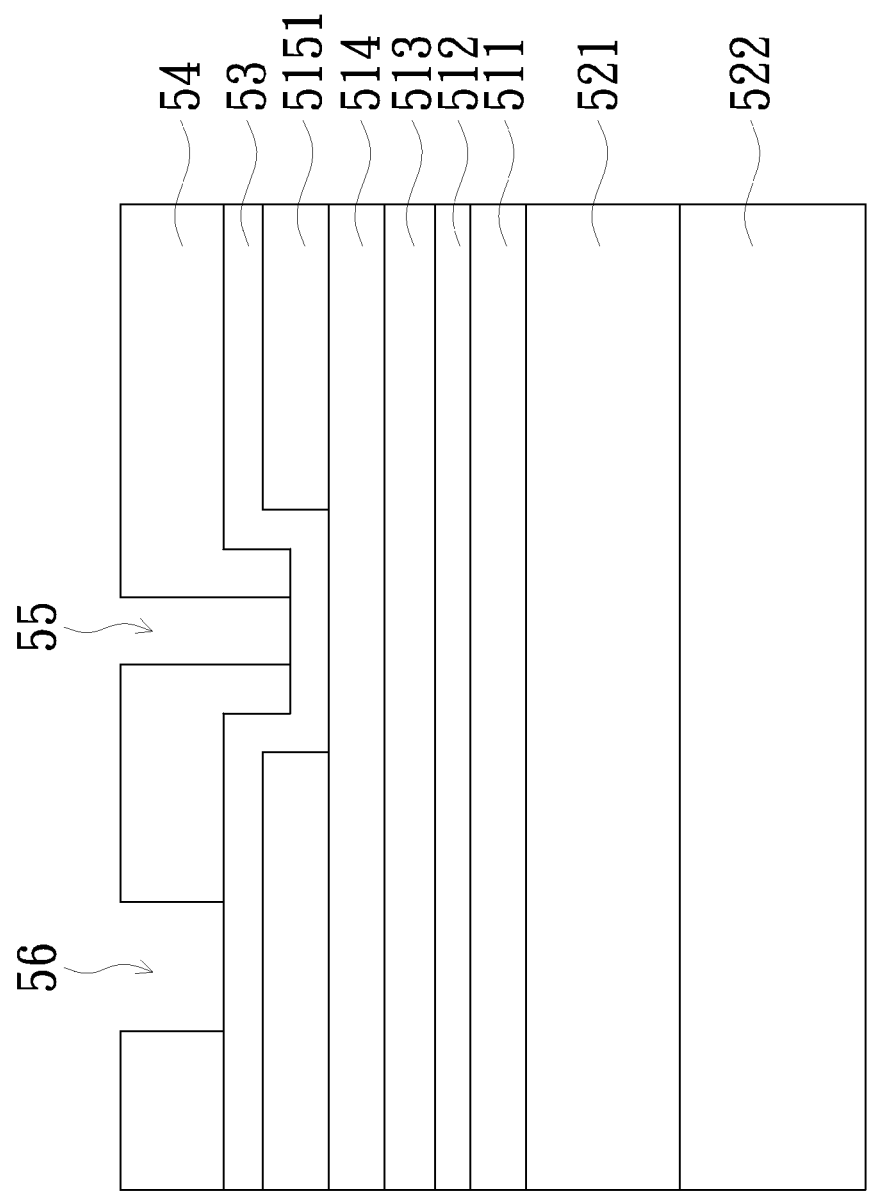

Then, as shown in FIG. 3D, a patterned photoresist layer 54 is provide to form a first trench 55 to expose a first portion of the cap layer 53 on the second dielectric layer 514 and to form a second trench 56 to expose a second portion of the cap layer 53 on the top metal layer 5151.

In FIG. 3E, the first portion of the cap layer 531 and a portion of the second dielectric layer 5141 underneath the first portion of the cap layer 531 are removed to expose the intermediate metal layer 513 and the second portion of the cap layer 531 is removed to expose the top metal layer 5151.

Figure 3F:
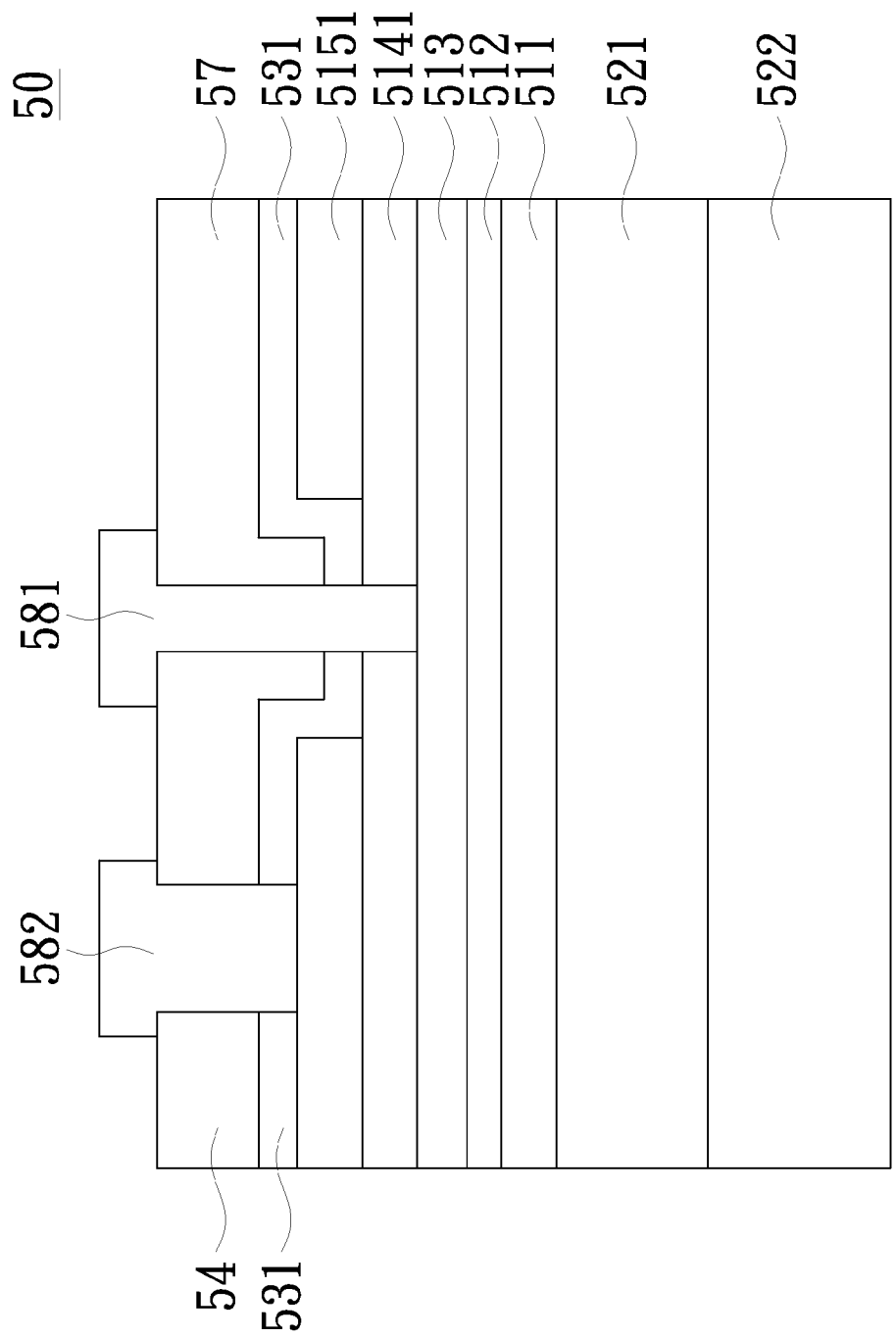

At last, in FIG. 3F, the patterned photoresist layer 54 is removed to form a patterned dielectric layer 57. A first plug 581 is formed by filling a conductor in the first trench 551 to connect the intermediate metal layer 513, and a second plug 582 is formed by filling a conductor in the second trench 561 to connect the top metal layer 5151. Accordingly, an MIM capacitor 50 using the second dielectric layer 5141 is formed in accordance with the second embodiment of present invention.

Please further refer to FIG. 4A to FIG. 4F for cross-sectional views showing a method for manufacturing an MIM capacitor structure 70 according to a third embodiment of the present invention. The method includes the steps described hereinafter.

Figure 4A:
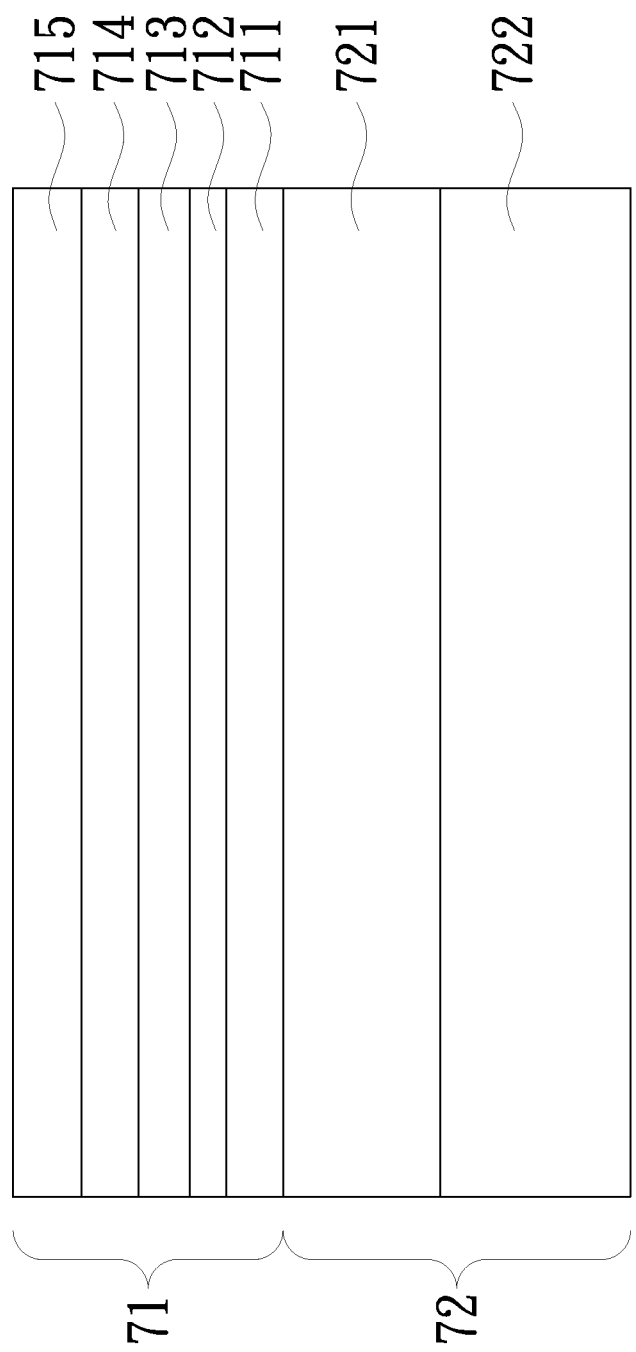
FIG. 4A to FIG. 4F are cross-sectional views showing a method for manufacturing an MIM capacitor structure according to a third embodiment of the present invention.

As shown in FIG. 4A, a 5-layered dual-dielectric structure 71 is provided on a substrate 72. The 5-layered dual-dielectric structure 71 includes a bottom metal layer 711, a first dielectric layer 712, an intermediate metal layer 713, a second dielectric layer 714 and a top metal layer 715 in order. The substrate 72 includes a low-k dielectric layer 721 on a metal layer 722. It should be noted that the first dielectric layer 712 and the second dielectric layer 714 have different thicknesses.

In the present embodiment, the elements in FIG. 4A use the same materials and thicknesses as the corresponding elements in FIG. 2A, and redundant descriptions thereof are not repeated herein.

Figure 4B:
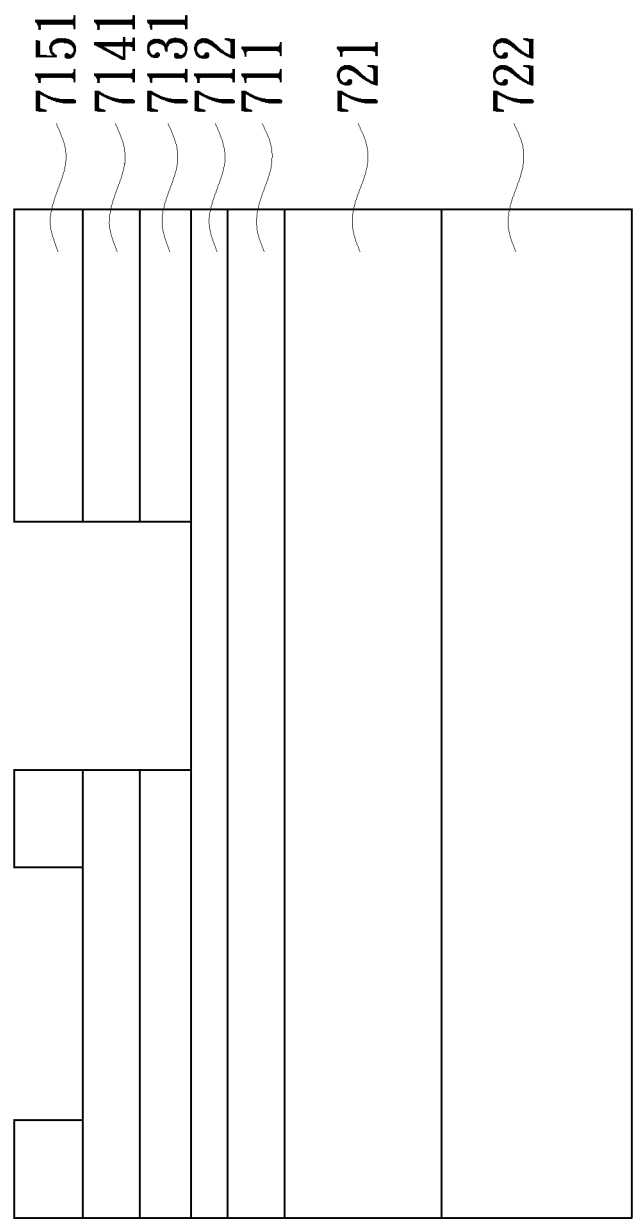

Then, as shown in FIG. 4B, the 5-layered dual-dielectric structure 71 is patterned to form a first trench and a second trench. The first trench is defined by the intermediate metal layer 7131, the second dielectric layer 7141 and the top metal layer 7151 that have been patterned to expose the first dielectric layer 712. Moreover, the second trench is defined by the top metal layer 7151 that has been patterned.

Figure 4C:
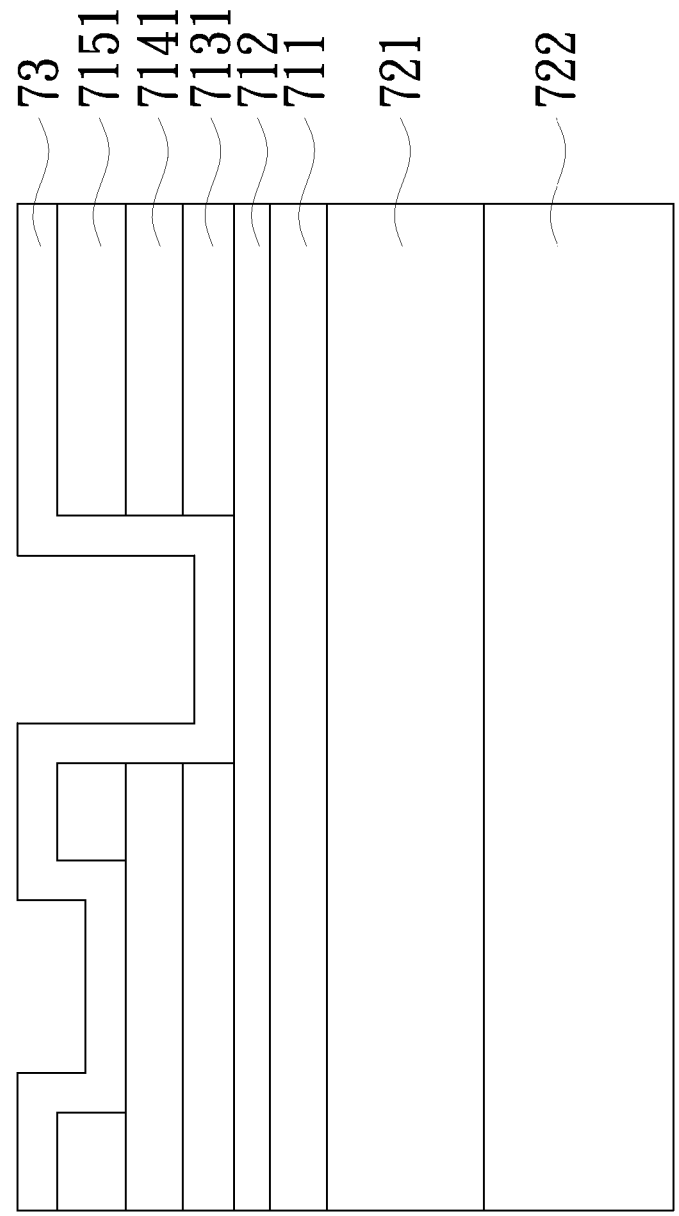

In FIG. 4C, a cap layer 73 is formed conformally on the 5-layered dual-dielectric structure 71. In the present embodiment, the cap layer 73 may include nitride. However, the present invention is not limited to nitride as being the material used in the cap layer 73.

Figure 4D:
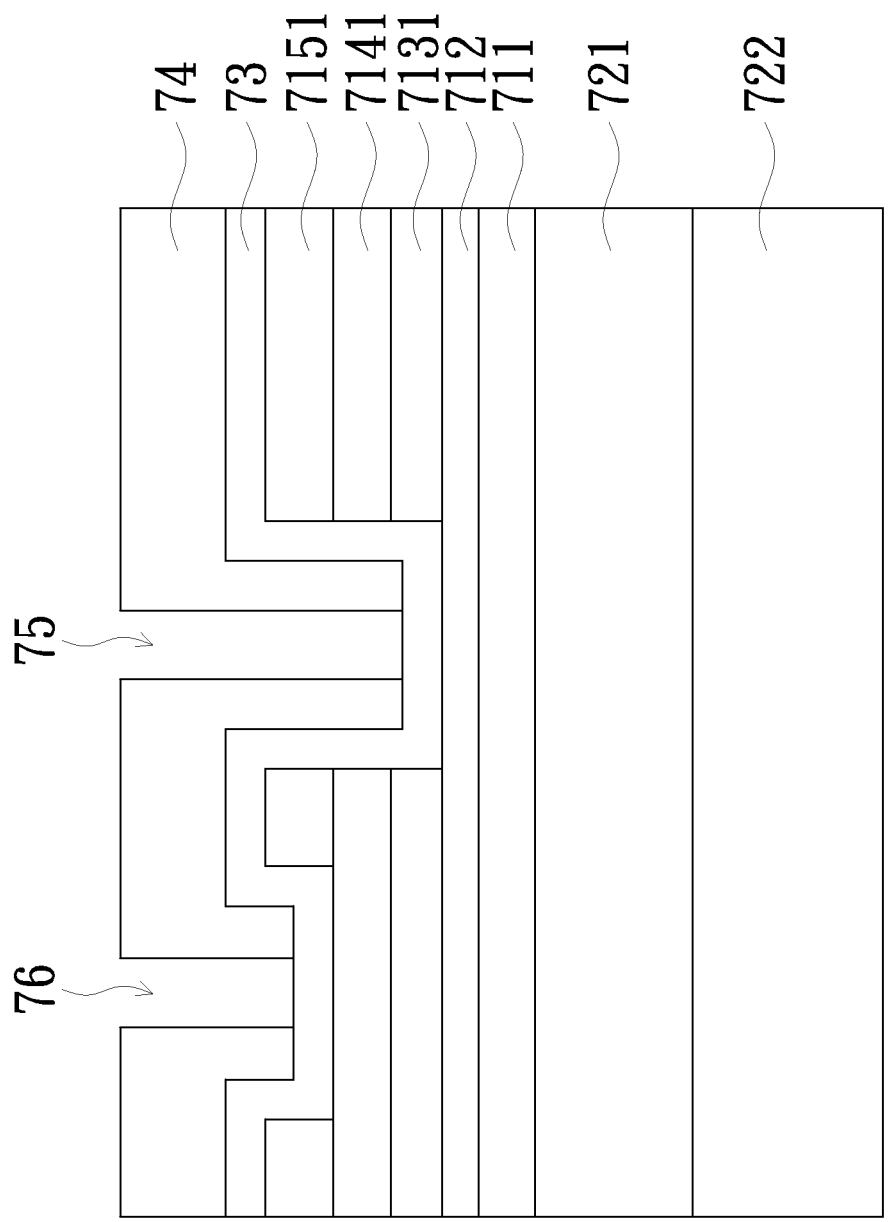

Then, as shown in FIG. 4D, a patterned photoresist layer 74 is provide to form a third trench 75 to expose a first portion of the cap layer 73 on the first dielectric layer 712 and a fourth trench 76 to expose a second portion of the cap layer 73 on the second dielectric layer 7141.

Figure 4E:
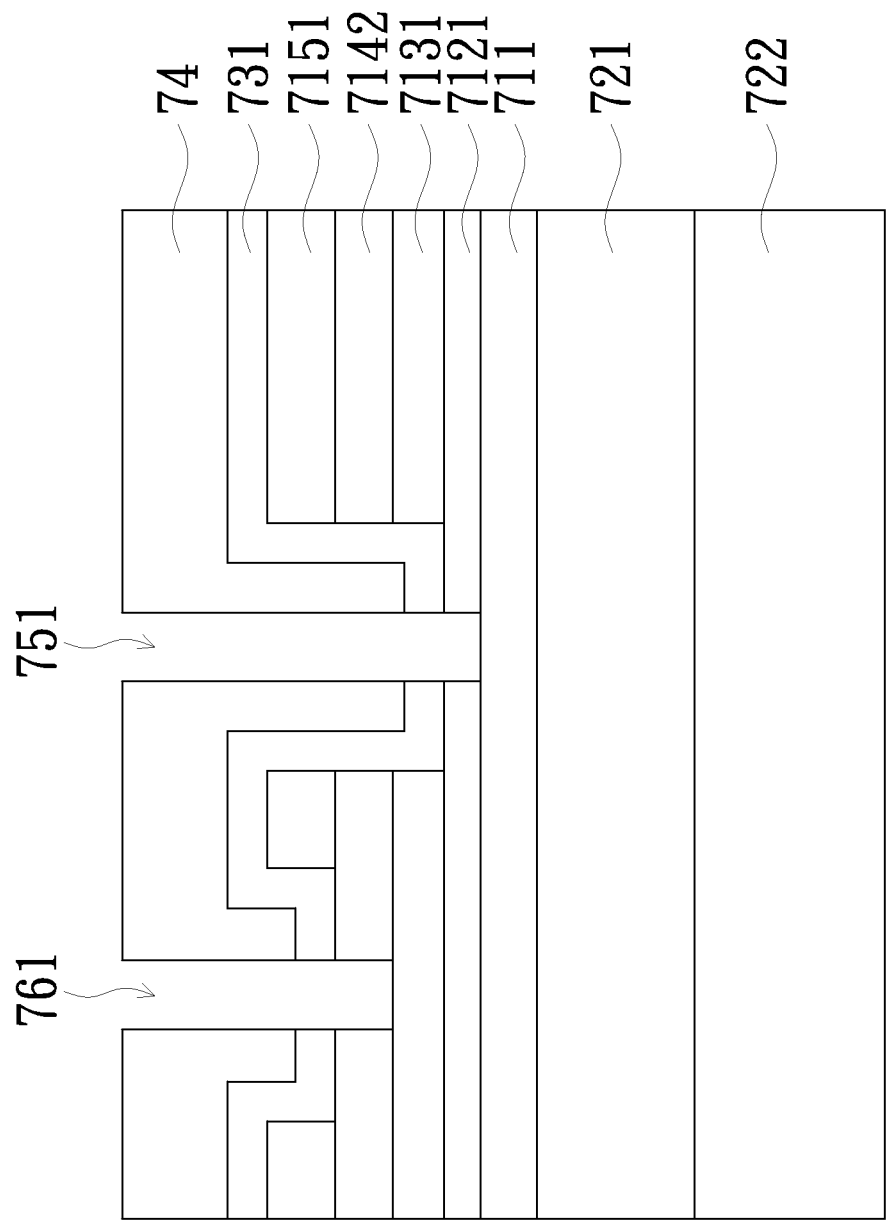

In FIG. 4E, the first portion of the cap layer 731 and a portion of the first dielectric layer 7121 underneath the first portion of the cap layer 731 are removed to expose the bottom metal layer 711, and the second portion of the cap layer 731 and a portion of the second dielectric layer 7142 underneath the second portion of the cap layer 731 are removed to expose the intermediate metal layer 7131.

Figure 4F:
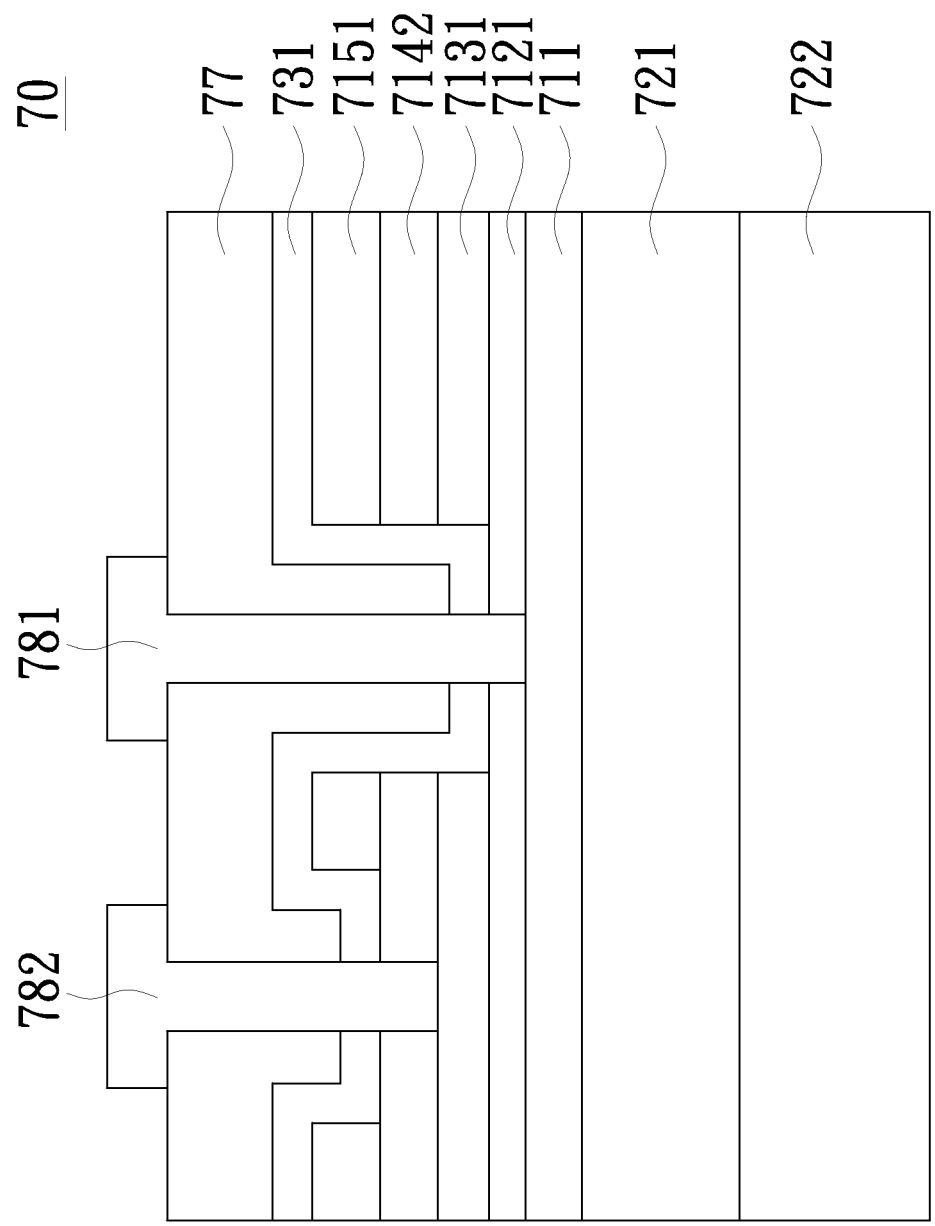

At last, in FIG. 4F, the patterned photoresist layer 74 is removed to form a patterned dielectric layer 77. A first plug 781 is formed by filling a conductor in the first trench 751 to connect the bottom metal layer 711, and a second plug 782 is formed by filling a conductor in the second trench 761 to connect the intermediate metal layer 7131. Accordingly, an MIM capacitor 70 using the first dielectric layer 7121 is formed according to the third embodiment of present invention.

It is noted that, in the present invention, a vertical capacitor structure is used to minimize the chip area occupied by the MIM capacitor structure, to provide various capacitances with flexible connections by plugs, and to provide an MIM capacitor structure for high density and/or high voltage applications.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A metal-insulator-metal (MIM) capacitor structure, comprising:
    a 5-layered dual-dielectric structure on a substrate, wherein said 5-layered dual-dielectric structure comprises a bottom metal layer, a first dielectric layer, an intermediate metal layer, a second dielectric layer and a top metal layer in order, and said first dielectric layer and said second dielectric layer have different thicknesses;
    a first plug;
    a second plug;
    a cap layer formed conformally on said 5-layered dual-dielectric structure and comprised of nitride; and
    a patterned dielectric layer formed directly and conformally on the cap layer,
    wherein said first plug connects said bottom metal layer or said intermediate metal layer, said second plug connects said top metal layer, and both of said first plug and said second plug contact the cap layer.

2. A metal-insulator-metal (MIM) capacitor structure, comprising:
    a 5-layered dual-dielectric structure on a substrate, wherein said 5-layered dual-dielectric structure comprises a bottom metal layer, a first dielectric layer, an intermediate metal layer, a second dielectric layer and a top metal layer in order, and said first dielectric layer and said second dielectric layer have different thicknesses;
    a first plug;
    a second plug;
    a cap layer formed conformally on said 5-layered dual-dielectric structure and comprised of nitride; and
    a patterned dielectric layer formed directly and conformally on the cap layer,
    wherein said first plug connects said bottom metal layer, said second plug connects said intermediate metal layer, and both of said first plug and said second plug contact the cap layer.

* * * * *